US012580410B2

(12) United States Patent
Mochizuki

(10) Patent No.: US 12,580,410 B2
(45) Date of Patent: Mar. 17, 2026

(54) CHARGING METHOD AND BACKUP POWER SUPPLY DEVICE

(71) Applicant: FDK CORPORATION, Tokyo (JP)

(72) Inventor: Shun Mochizuki, Tokyo (JP)

(73) Assignee: FDK CORPORATION, Tokyo (JP)

( * ) Notice: Subject to any disclaimer, the term of this patent is extended or adjusted under 35 U.S.C. 154(b) by 815 days.

(21) Appl. No.: 17/938,664

(22) Filed: Oct. 6, 2022

(65) Prior Publication Data

US 2023/0133960 A1     May 4, 2023

(30) Foreign Application Priority Data

Nov. 2, 2021     (JP) ................................. 2021-179506

(51) Int. Cl.
H02J 7/00          (2006.01)
G01R 31/374     (2019.01)
G01R 31/396     (2019.01)

(52) U.S. Cl.
CPC ...... H02J 7/007194 (2020.01); G01R 31/396 (2019.01); H02J 7/0013 (2013.01); G01R 31/374 (2019.01)

(58) Field of Classification Search
CPC ...... H02J 7/007194; H02J 7/0013; H02J 9/06; G01R 31/396; G01R 31/374; Y02E 60/10
USPC ....................................................... 320/107
See application file for complete search history.

(56) References Cited

U.S. PATENT DOCUMENTS

2013/0285613 A1     10/2013     Fujita et al.
2017/0214253 A1      7/2017     Kim et al.
2021/0151811 A1      5/2021     Damgaard

FOREIGN PATENT DOCUMENTS

EP          3849046 A1     7/2021
JP          4874633 B2 *   2/2012
JP       2017060364 A      3/2017

OTHER PUBLICATIONS

Extended European Search Report dated Mar. 17, 2023, for corresponding European Application No. 22200031.7.

* cited by examiner

*Primary Examiner* — Julian D Huffman
*Assistant Examiner* — Aiman Bickiya
(74) *Attorney, Agent, or Firm* — Kinney & Lange, P.A.

(57)          ABSTRACT

A charging method for supplementarily charging a plurality of secondary batteries accommodated in a casing on a regular basis includes the steps of: charging the plurality of secondary batteries at the same time at the time of initial supplementary charging; acquiring each of peak temperatures during charging of the plurality of secondary batteries; listing combination patterns when the plurality of secondary batteries are split into a plurality of charging groups; predicting, for each of the combination patterns, each of the peak temperatures in a case in which charging is performed for each of the charging groups, on the basis of the peak temperatures at the time of the initial supplementary charging; and split-charging the plurality of secondary batteries in the combination pattern that minimizes a variation in the predicted peak temperatures.

10 Claims, 8 Drawing Sheets

FIG. 3

SOC [%] vs TIME [MONTH]

FIG. 5

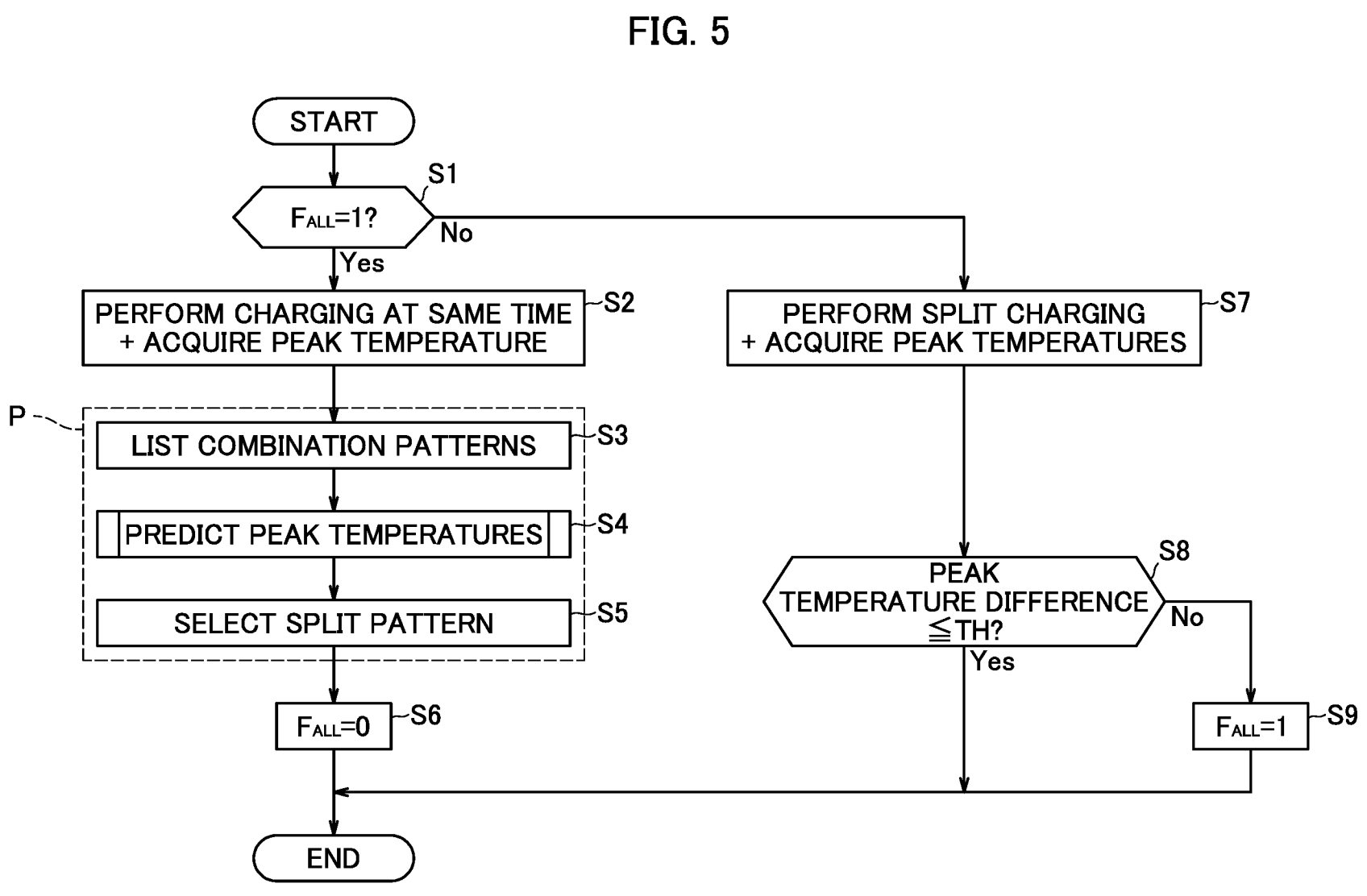

START

S1
$F_{ALL}=1$?

No → S7
PERFORM SPLIT CHARGING + ACQUIRE PEAK TEMPERATURES

S8
PEAK TEMPERATURE DIFFERENCE ≦TH?

No → S9
$F_{ALL}=1$

Yes

Yes → S2
PERFORM CHARGING AT SAME TIME + ACQUIRE PEAK TEMPERATURE

P

S3
LIST COMBINATION PATTERNS

S4
PREDICT PEAK TEMPERATURES

S5
SELECT SPLIT PATTERN

S6
$F_{ALL}=0$

END

FIG. 6

CHARGING METHOD AND BACKUP POWER SUPPLY DEVICE

CROSS-REFERENCE TO RELATED APPLICATION(S)

This application claims priority to Japanese Application No. 2021-179506 filed on Nov. 2, 2021, which is incorporated by reference herein in its entirety.

BACKGROUND

Technical Field

The present disclosure relates to a charging method and a backup power supply device.

Description of the Related Art

A backup power supply device can cause an operation of a load device to continue in a state in which power is not supplied from an external power supply to the load device due to power interruption or the like, by supplying power from a secondary battery charged in advance to the load device. In general, the backup power supply device incorporates a plurality of secondary batteries and is connected to a conducting path between the external power supply to the load device, and the secondary batteries are thereby charged with power supplied from the external power supply at the normal time with no power interruption.

In the backup power supply device as described above, the plurality of secondary batteries are connected in a series-parallel manner as assembled batteries in accordance with specifications such as a current, a voltage, a power capacity, and the like that can be output. At this time, a variation may occur in temperature of each of the plurality of secondary batteries due to arrangement inside a casing and an influence of a cooling mechanism, and a variation may occur in each voltage together. Thus, according to a power storage system described in Japanese Patent Laid-Open No. 2017-60364, for example, a degradation state is determined on the basis of the temperature of each secondary battery, and a voltage of each secondary battery is adjusted in accordance with the degradation state.

However, according to the related art as described above, it is possible to adjust the voltage in accordance with the degradation state of each secondary battery, while the variation itself in the temperature of each secondary battery is not curbed, and there is a likelihood that factors of the degradation such as a temperature rise may concentrate on some specific secondary batteries, for example. In particular, since the backup power supply device does not perform active discharging as long as power interruption does not occur, it is only necessary to supplementarily charge the power corresponding to the decrease due to natural discharging on a regular basis, and the supplementary charging is often performed at a low rate. Therefore, secondary batteries that are exposed to a high-temperature state for a relatively long period of time due to the supplementary charging are continuously exposed to the high-temperature state in the following supplementary charging as well. As a result, there is a concern that proportions of currents discharged from secondary batteries in which degradation advances relatively slowly from among the plurality of secondary batteries increase in the backup power supply device at the time of power interruption when discharging is needed, and a dischargeable time (backup time) is further shortened as compared with a time set on the assumption of degradation of the secondary battery, the temperature of which is raised to the highest temperature.

The present disclosure was made in view of such a problem, and an object thereof is to provide a charge method and a backup power supply device that curb shortening of a dischargeable time due to a variation in temperatures of secondary batteries at the time of charging.

SUMMARY

In order to achieve the aforementioned object, a charging method according to the present disclosure is a charging method for supplementarily charging a plurality of secondary batteries accommodated in a casing on a regular basis, the method including the steps of: charging the plurality of secondary batteries at the same time at the time of initial supplementary charging; acquiring each of peak temperatures during charging of the plurality of secondary batteries; listing combination patterns when the plurality of secondary batteries are split into a plurality of charging groups; predicting, for each of the combination patterns, each of the peak temperatures in a case in which charging is performed for each of the charging groups, on the basis of the peak temperatures at the time of the initial supplementary charging; and split-charging the plurality of secondary batteries in the combination pattern that minimizes a variation in the predicted peak temperatures.

Also, in order to achieve the aforementioned object, a backup power supply device according to the present disclosure includes: a plurality of secondary batteries that are accommodated in a casing; a charging switch that individually connects and disconnects charging power of the plurality of secondary batteries; a temperature sensor that individually measures temperatures of the plurality of secondary batteries; and a control device that supplementarily charges the plurality of secondary batteries via the charging switch on a regular basis, the control device charging the plurality of secondary batteries at the same time at the time of initial supplementary charging and acquiring each of peak temperatures, listing combination patterns when the plurality of secondary batteries are split into a plurality of charging groups, predicting, for each of the combination patterns, each of the peak temperatures in a case in which charging is performed for each of the charging groups, on the basis of the peak temperatures at the time of the initial supplementary charging, and split-charging the plurality of secondary batteries in the combination pattern that minimizes a variation in the predicted peak temperatures.

BRIEF DESCRIPTION OF THE DRAWINGS

The present disclosure will become more fully understood from the detailed description given hereinafter and the accompanying drawings which are given by way of illustration only, and thus, are not limitative of the present disclosure, and wherein:

FIG. 3 is a graph representing changes in charge amounts of a plurality of secondary batteries;

FIG. 5 is a flowchart representing a charging method of the backup power supply device;

FIG. 6 is waveforms representing changes in temperatures in a case in which the plurality of secondary batteries are charged at the same time;

DETAILED DESCRIPTION

Hereinafter, an embodiment of the present disclosure will be described in detail with reference to the drawings. Note that the present disclosure is not limited to the content described below and can be performed with arbitrary modifications without changing the gist thereof. Also, all the drawings used to describe the embodiment schematically illustrate components, partial emphasis, enlargement, downsizing, omission, and the like may be added for further understanding, and the drawings may not accurately represent the scales, the shapes, and the like of the components.

Figure 1:
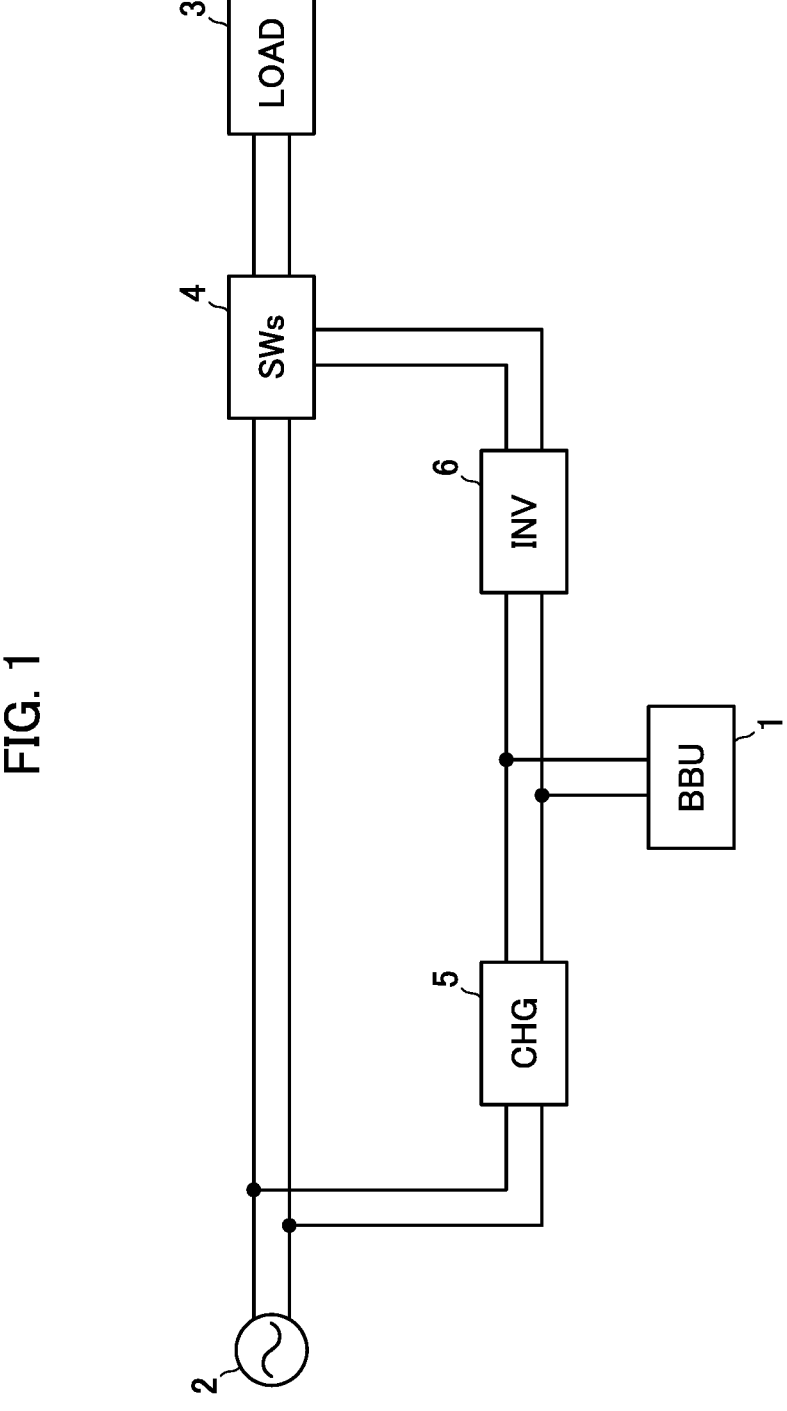
FIG. 1 is a circuit diagram representing a power supply system in a case in which a backup power supply device is used.

FIG. 1 is a circuit diagram representing a power supply system in a case in which a backup power supply device 1 is used. The backup power supply device 1 is a so-called auxiliary power supply (battery backup unit: BBU) or an uninterruptible power supply device (uninterruptible power supply: UPS) that is connected to a DC conducting path that bypasses an AC conducting path from an external power supply 2 to an external load 3 and continuously supplies power accumulated therein to the external load for a specific period of time in a case in which it becomes not possible to supply power from the external power supply 2 to the external load 3 at the time of power interruption.

The external power supply 2 is an AC commercial power supply in the present embodiment and functions as a power supply source for supplying power to the external load 3 via a system switching switch 4 and charging the backup power supply device 1 via a charger 5 at a normal time with no occurrence of power interruption.

The external load 3 is an electronic device that operates with AC power from the external power supply 2 at the normal time and continues its operation by power being supplied from the backup power supply device 1 via an inverter 6 and the system switching switch 4 at the time of power interruption.

The system switching switch 4 is constituted by a switch mechanism such as a power MOSFET or a contactor (electromagnetic contactor), for example, and performs control for switching the power supply system by establishing conduction between the external power supply 2 and the external load 3 at the normal time and establishing conduction between the inverter 6 and the external load 3 in a case in which power interruption is detected.

The charger 5 is constituted by an AC-DC converter, converts AC power from the external power supply 2 into DC power of a voltage that is suitable for charging the backup power supply device 1, and outputs the DC power as charging power at the normal time and in a case in which it is necessary to charge the backup power supply device 1.

The inverter 6 converts the DC power output by the backup power supply device 1 into AC power and outputs the AC power to the system switching switch 4 when power interruption occurs.

Here, the power supply system is not limited to the form illustrated in FIG. 1, and an appropriate modification can be made as long as the backup power supply device 1 can operate with the circuit. Also, the backup power supply device 1 may incorporate the functions of the charger 5 and the inverter 6 by mounting a bidirectional converter, for example.

Figure 2:
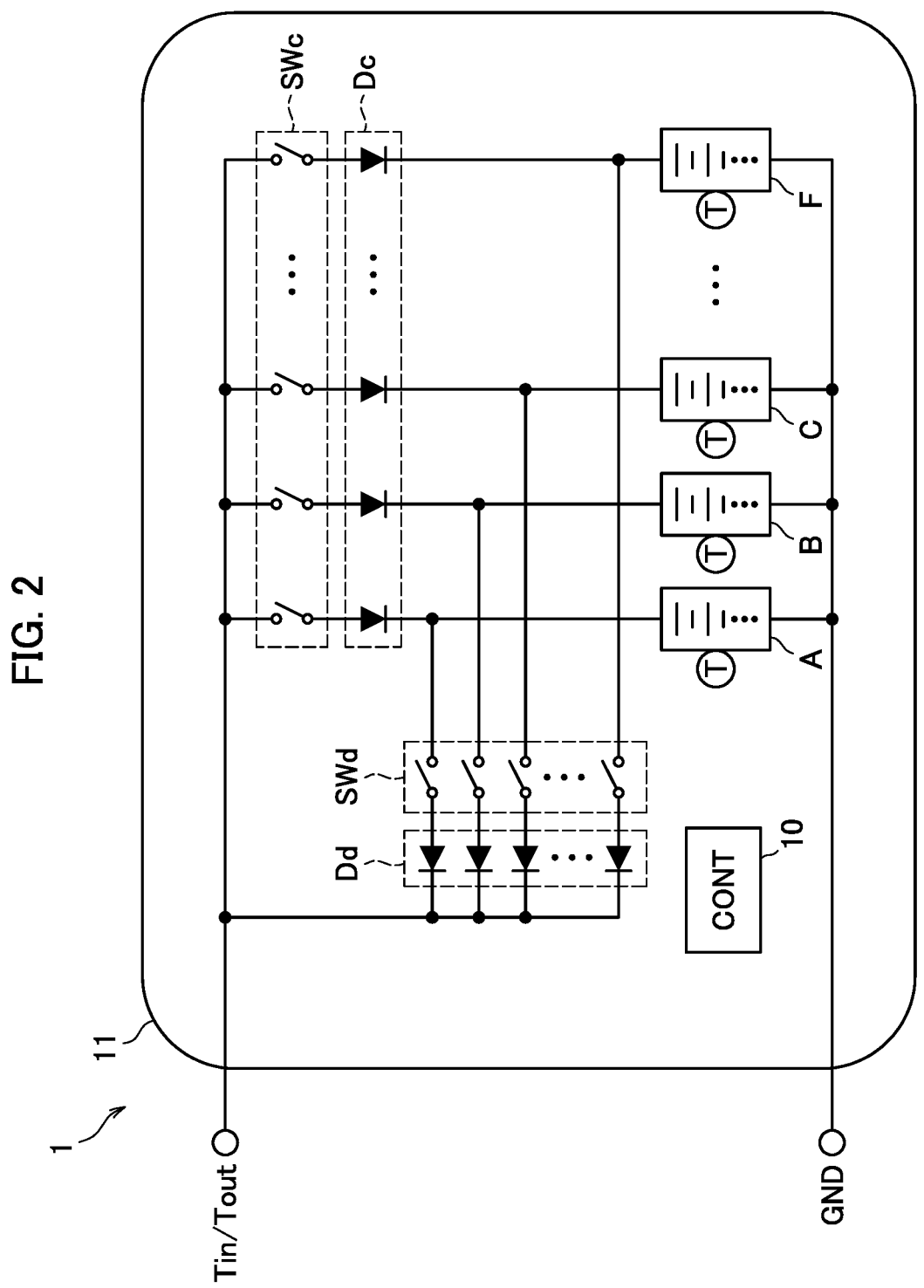
FIG. 2 is a circuit diagram representing an internal configuration of the backup power supply device.

Next, an internal configuration of the backup power supply device 1 will be described. FIG. 2 is a circuit diagram representing an internal configuration of the backup power supply device 1. The backup power supply device 1 is configured such that a pair of charging and discharging terminals constituted by an input/output terminal Tin/Tout and a ground terminal GND is connected to a DC conducting path between the charger 5 and the inverter 6 and a plurality of secondary batteries A to F, charging switches SWc, charging diodes Dc, discharging switches SWd, discharging diodes Dd, a plurality of temperature sensors T, and a control device 10 are accommodated in a casing 11.

Each of the secondary batteries A to F is constituted by a chargeable/dischargeable nickel hydride battery, for example, and is configured as an assembled battery in which a plurality of battery cells are connected in series in the present embodiment. Also, each of the secondary batteries A to F is connected in parallel between the input/output terminal Tin/Tout and the ground terminal GND. In addition, operations in stand-by use in which the secondary batteries A to F constantly stand by for power interruption are assumed, and the secondary batteries A to F are managed such that the charge amounts (state of charge: SOC) are maintained in states that are close to 100%. Note that although six assembled batteries are connected in parallel in the present embodiment, it is possible to appropriately change the number of assembled batteries in accordance with a specification, and the secondary batteries A to F may be configured to be connected in series by adopting the technique in Japanese Patent Application No. 2018-168047 of the applicant.

The charging switches SWc are constituted by a plurality of metal oxide semiconductor field effect transistors (MOSFETs), for example, and individually connect and disconnect charging power of the plurality of secondary batteries A to F by being provided in a charging path between each of the secondary batteries A to F and the input/output terminal Tin/Tout. Also, the charging diodes Dc are constituted by a plurality of rectifier elements and prevent backflow of a charging/discharging current for each of the secondary batteries A to F.

The discharging switches SWd are constituted by a plurality of MOSFETs, for example, and individually connect and disconnect discharge power of the plurality of secondary batteries A to F by being provided in a discharging path between each of the secondary batteries A to F and the input/output terminal Tin/Tout. Also, the discharging diodes Dd are constituted by a plurality of rectifier elements and prevent backflow of a charging/discharging current for each of the secondary batteries A to F.

The plurality of temperature sensors T are constituted by thermistors, for example, and individually measure the temperature of each of the secondary batteries A to F by being provided to be adjacent to each of the secondary batteries A to F.

The control device 10 is configured of a known microcomputer control circuit, for example, individually monitors the voltages and the temperatures of the secondary batteries A to F, and controls the charging switches SWc and the discharging switches SWd at the time of charging and discharging the secondary batteries A to F. Here, the control device 10 brings all the secondary batteries A to F into a discharging state by controlling all the charging switches SWc to bring them into an OFF state and controlling all the discharging switches SWd to bring them into an ON state when power interruption occurs. Also, the control device 10 brings all the secondary batteries A to F into a charging state by controlling all the charging switches SWc to bring them into the ON state and controlling all the discharging switches SWd to bring them into the OFF state, causes the SOC to quickly achieve 100% recovery, and prepares for the next power interruption after power is restored.

On the other hand, in a case in which the SOC gradually decreases due to self-discharging of the secondary batteries A to F while they stand by for a long period of time, the control device 10 causes the charge amount of each of the secondary batteries A to F to recover through low-rate supplementary charging. Details of the procedure for controlling the supplementary charging will be described later.

Figure 3:
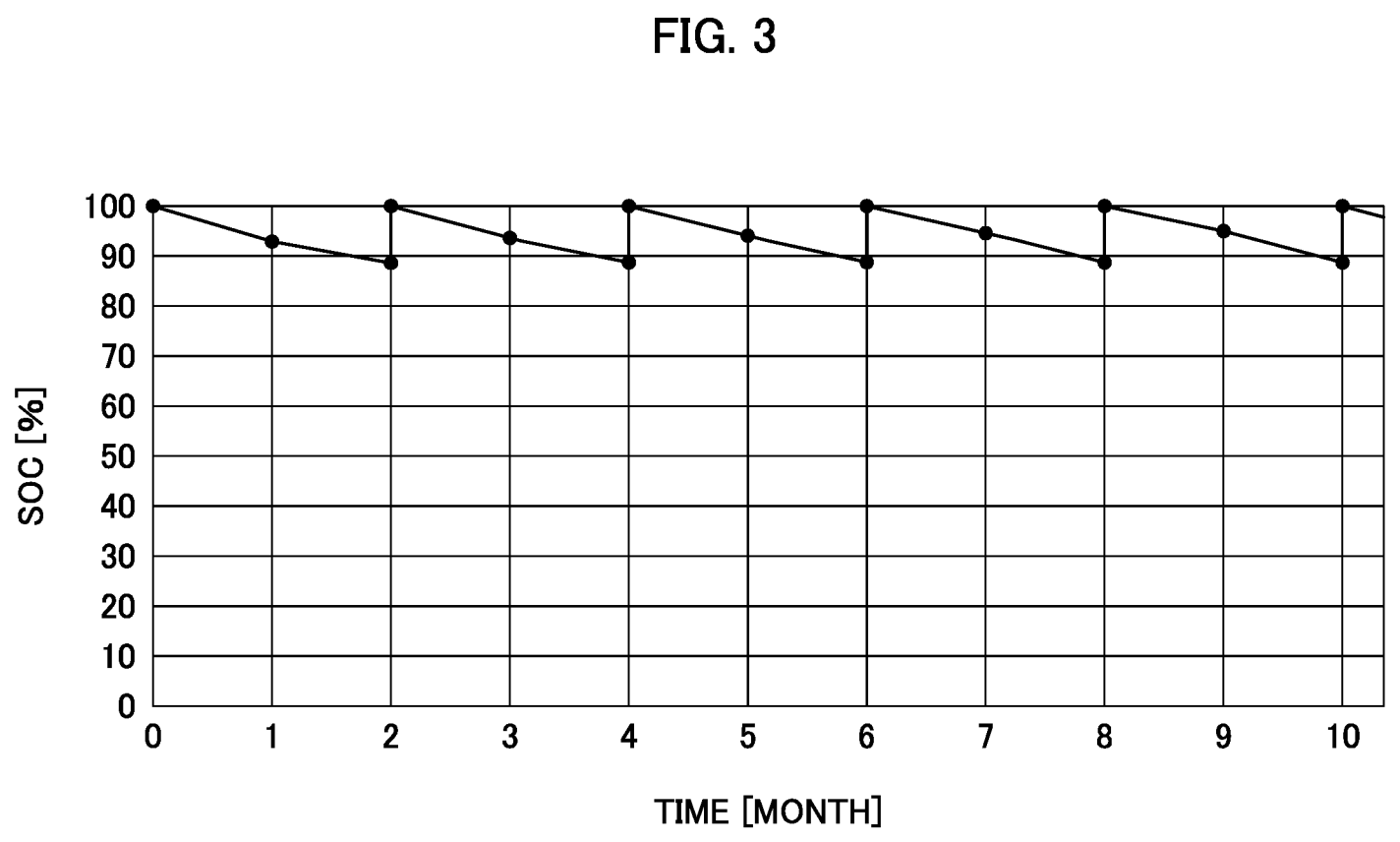

FIG. 3 is a graph representing changes in charge amounts of the secondary batteries A to F. In FIG. 3, the horizontal axis represents the months that has elapsed after a start of an operation of the backup power supply device 1, and the vertical axis represents the charge amounts (SOC) of the secondary batteries A to F. Also, it is assumed that no power interruption occurs in the range illustrated in FIG. 3.

Operations of the secondary batteries A to F are started with the charge amounts of 100%, and the charge amounts gradually decrease due to self-discharging with elapse of days. On the other hand, the control device 10 performs control for supplementarily charging the secondary batteries A to F via the charging switches SWc in a case in which the charge amounts decrease to 90% set as a threshold value, for example. For easiness of explanation, it is assumed here that the self-discharging is performed from 100% to 90% at a cycle of about 2 months in regard to the charge amounts of the secondary batteries A to F, and the charge amounts are caused to recover to 100% by supplementarily charging the secondary batteries A to F on the regular basis every time.

Figure 4:
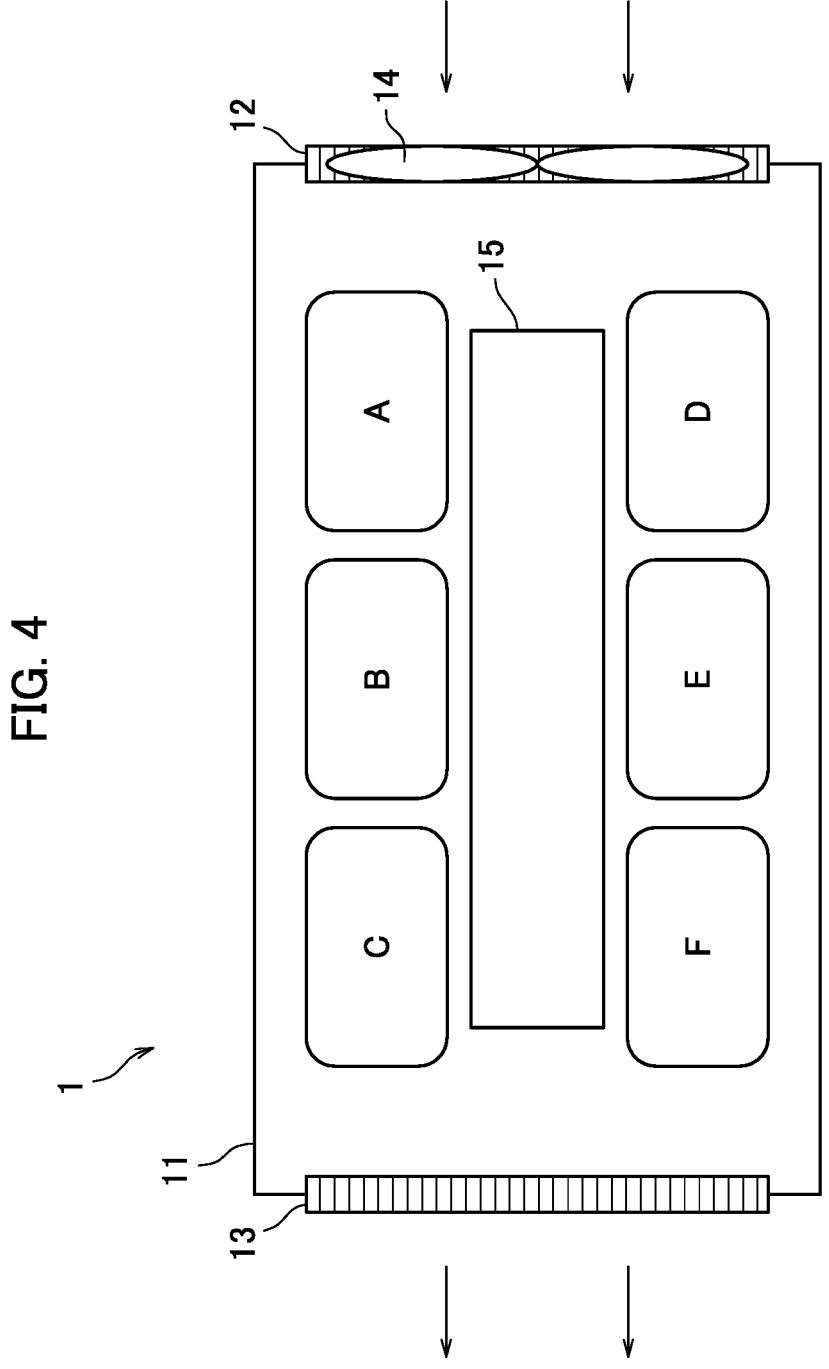
FIG. 4 is a schematic diagram representing an internal layout of the backup power supply device.

FIG. 4 is a schematic diagram representing an internal layout of the backup power supply device 1. The backup power supply device 1 according to the present embodiment includes an intake port 12 and an exhaust port 13 that establish communication between the inside and the outside of the casing 11, and the intake port 12 is provided with an air cooling fan 14. Note that the number of intake ports 12 and exhaust ports 13 can be appropriately changed, and air cooling fans 14 may be provided at the exhaust ports 13 for exhausting air. The air cooling fans 14 may operate during charging/discharging of the secondary batteries A to F, or may operate in a case in which the temperatures of the secondary batteries A to F are equal to or greater than a specific temperature.

Also, a circuit substrate 15 with the charging switches SWc, the charging diodes Dc, the discharging switches SWd, the discharging diodes Dd, the control device 10, and the like mounted thereon extends along an air flow direction inside the casing, and the secondary batteries A to C and the secondary batteries D to F are similarly disposed along the air flow direction on both the sides thereof, inside the backup power supply device 1 according to the present embodiment. In other words, the secondary batteries A and D are located on a windward side of the air flow direction while the secondary batteries C and F are located on a downwind side of the aid flow direction, in the present embodiment. Note that the layout of the secondary batteries A to F and the circuit substrate 15 can be appropriately changed, and other arrangement may be adopted in accordance with the specification.

Also, arrangement of the secondary batteries A to F in the casing and the air flow direction inside the casing caused by the intake port 12, the exhaust port 13, and the air cooling fan 14 are stored in the control device 10 in advance in order to perform supplementary charging by a charging method, which will be described later. Here, the arrangement inside the casing and the air flow direction are information for estimating radiant heat and cooling efficiency at the time of charging of the secondary batteries A to F, and more specifically, coordinates of the secondary batteries A to F inside the casing 11, adjacency, and correspondence and a distance between each battery and the internal wall of the casing 11, for example, may be included.

Here, there may be a case in which a difference occurs in a temperature rise at the time of charging due to the layout inside the casing 11 not only when all the secondary batteries A to F of the same specification are charged at the same time but also when the secondary batteries A to F are individually charged one by one in the backup power supply device 1. There is a likelihood that variations occur in peak temperatures of the secondary batteries A to F at the time of charging due to various factors such as mutual adjacency, adjacency with the internal wall of the casing 11, a positional relationship such as a windward side and downwind side caused by the cooling fan 14, a case in which a heat generation source is adjacent to the outside of the casing 11, and a case in which a heat generating component is mounted on a part of the circuit substrate 15, as described above, for example.

At this time, in a case in which the secondary batteries C and F are particularly degraded due to a temperature rise caused by regular supplementary charging, for example, a discharged current concentrates on the other secondary batteries A, B, D, and E at the time of discharging, and there is thus a concern that a dischargeable time (backup time) may be shortened. Thus, the control device 10 of the backup power supply device 1 reduces the concern by performing supplementary charging by the charging method, which will be described below.

FIG. 5 is a flowchart representing the charging method of the backup power supply device 1. The control device 10 executes the procedure of the charging method illustrated in FIG. 5 at a timing when the supplementary charging of the secondary batteries A to F is needed. Here, the control device 10 prepares a simultaneous charging flag FALL that becomes 1 in a case in which all the secondary batteries A to F are charged at the same time and becomes 0 in a case in which the secondary batteries A to F are split into a plurality of groups and are charged in a split manner, and an operation of the backup power supply device 1 is started by setting an initial value FALL=1 at the time of 0 months on the horizontal axis in FIG. 3. Also, the control device 10 performs initial supplementary charging in accordance with the flowchart in FIG. 5 when an elapse time after the start of the operation is two months as illustrated in FIG. 2.

Once the procedure of the supplementary charging is started, the control device 10 determines whether or not the simultaneous charging flag has been set to FALL=1 (Step S1). At this time, FALL=1 is determined as an initial value in the initial supplementary charging (Yes in Step S1).

In the case in which FALL=1 is determined in Step S1, the control device 10 charges all the secondary batteries A to F at the same time as supplementary charging (simultaneous charging step, Step S2) by switching all the charging switches SWc to ON and acquires, with the plurality of temperature sensors T, a peak temperature of each of the secondary batteries A to F during charging (peak temperature acquisition step, Step S2). The supplementary charging is continued until full charging is detected by a known $-\Delta V$ scheme.

Once the initial supplementary charging is completed, the control device 10 performs split pattern determination processing P that is needed to perform the following supplementary charging as split charging.

First, the control device 10 lists combination patterns when the secondary batteries A to F are split into a plurality of charging groups (listing step, Step S3). Here, in a case in which the secondary batteries A to F are split into two charging groups including the same number of batteries, various combination patterns such as <A, B, F: D, E, C>, <A, C, E: D, B, F>, . . . are listed on the assumption that the way to split the secondary batteries into a first group including the secondary batteries A to C and a second group including the secondary batteries D to F is represented as <A, B, C: D, E, F>, for example. Also, the number of charging groups is not limited to two, and the classification may be made into three or more charging groups like <A, B: C, D: E, F>, for example. Further, even in the case in which the splitting is made into two charging groups, the number of the batteries in each group is not necessarily the same, and grouping like <A, B: C, D, E, F>, for example, may be made. Also, the control device 10 lists all these combination patterns unless some arbitrary restriction is provided to the grouping.

Note that since it is possible to perform the aforementioned listing step if the number of batteries provided in the backup power supply device 1 is determined, the control device 10 may store all the listed combination patterns before the operation of the backup power supply device 1.

Next, the control device 10 predicts, for each of the listed combination patterns, each peak temperature in a case in which the secondary batteries A to F are charged for each charging groups, on the basis of the peak temperature at the time of the initial supplementary charging (prediction step, Step S4). More specifically, in a case in which it is assumed that the control device 10 selects a combination pattern <A, B, C: D, E, F> and charges the secondary batteries A to C at the same time and then charges the secondary batteries D to F at the same time, the control device 10 predicts to what degrees the peak temperature of each of the secondary batteries A to F will be raised.

At this time, the control device 10 can perform more accurate prediction in consideration of an influence of radiant heat due to adjacency of the secondary batteries A to C and cooling efficiency of the air cooling fan 14, by correcting predicted values of the peak temperatures depending on the arrangement inside the casing and the air flow direction stored in advance in the control device 10 using, as a base, peak temperatures at the time of the initial supplementary charging in Step S2.

Also, the control device 10 calculates the predicted values of the peak temperatures for each of the listed combination patterns by similarly predicting the peak temperature of each of the secondary batteries A to F for the combination patterns other than <A, B, C: D, E, F> in the prediction step.

Then, the control device 10 selects a combination pattern that minimizes a variation in predicted peak temperatures of the secondary batteries A to F from among the listed combination patterns as a split pattern for the next supplementary charging (Step S5). More specifically, the control device 10 calculates a difference between a maximum value and a minimum value of the predicted values of the peak temperatures of the secondary batteries A to F for each of the listed combination patterns. Then, the control device 10 selects a combination pattern from which the minimum difference has been calculated.

Once the split pattern determination processing P is completed, the control device 10 sets the simultaneous charging flag to FALL=0 (Step S6) and ends the flowchart in FIG. 5 for the initial supplementary charging once.

Next, the control device 10 monitors SOC of the secondary batteries A to F and starts the flowchart again at a timing when supplementary charging is needed. In other words, the control device 10 performs the second supplementary charging in accordance with the flowchart in FIG. 5 when the elapse time after the start of the operation is four months as illustrated in FIG. 2.

Once the procedure of the second supplementary charging is started, the control device 10 determines "No" in Step S1 since the simultaneous charging flag has been set to FALL=0 in Step S6 in the initial supplementary charging.

Then, the control device 10 executes split charging of successively performing supplementary charging on the secondary batteries A to F split into a plurality of charging groups in the combination pattern selected in the previous supplementary charging (split charging step, Step S7). Also, the control device 10 acquires, with the plurality of temperature sensors T, each of the peak temperatures of the secondary batteries A to F during charging similarly to the initial supplementary charging (Step S7) at this time.

In this manner, the secondary batteries A to F can not only curb an overall temperature rise through split charging but also reduce a difference in the individual degradation speeds since the combination pattern that minimizes the difference in peak temperature has been selected.

Also, once the split charging of the secondary batteries A to F is completed, the control device 10 checks the difference in peak temperatures of the secondary batteries A to F measured in Step S7 and determines whether the peak temperature difference is equal to or less than a temperature threshold value TH set in advance (Step S8). Here, the temperature threshold value TH is a value that is arbitrarily set in advance to determine a variation in peak temperatures of the second batteries A to F during charging, and it is assumed that TH=5° is set in the present embodiment. In other words, whether the difference between the maximum value and the minimum value of the peak temperatures of the secondary batteries A to F is equal to or less than 5° is determined in Step S8.

In a case in which it is determined that the peak temperature difference is equal to or less than the temperature threshold value TH (Yes in Step S8), the control device 10 determines that it is possible to perform, in the next supplementary charging as well, the split charging in the combination pattern used in the current supplementary charging and ends the procedure of the supplementary charging with the simultaneous charging flag remained to be set to FALL=0.

On the other hand, in a case in which the variation in peak temperature in the split charging step becomes greater than the temperature threshold value TH due to a situation such as a change in surrounding environment (No in Step S8) in regular repetition of supplementary charging during a long-term operation of the backup power supply device 1, the control device 10 sets the simultaneous charging flag to FALL=1 and ends the procedure of the supplementary charging (Step S9). In this manner, the control device 10 performs simultaneous charging with the next supplementary charging regarded as initial supplementary charging and updates the combination pattern that minimizes the variation in peak temperatures by executing the split pattern determination processing P.

Note that although the timing at which the combination pattern is to be updated is determined by comparing the peak temperature difference with the temperature threshold value TH here, the number of times of the split charging may be counted, and the combination pattern may be updated at the timing at which a predetermined number of times is reached.

Figure 6:
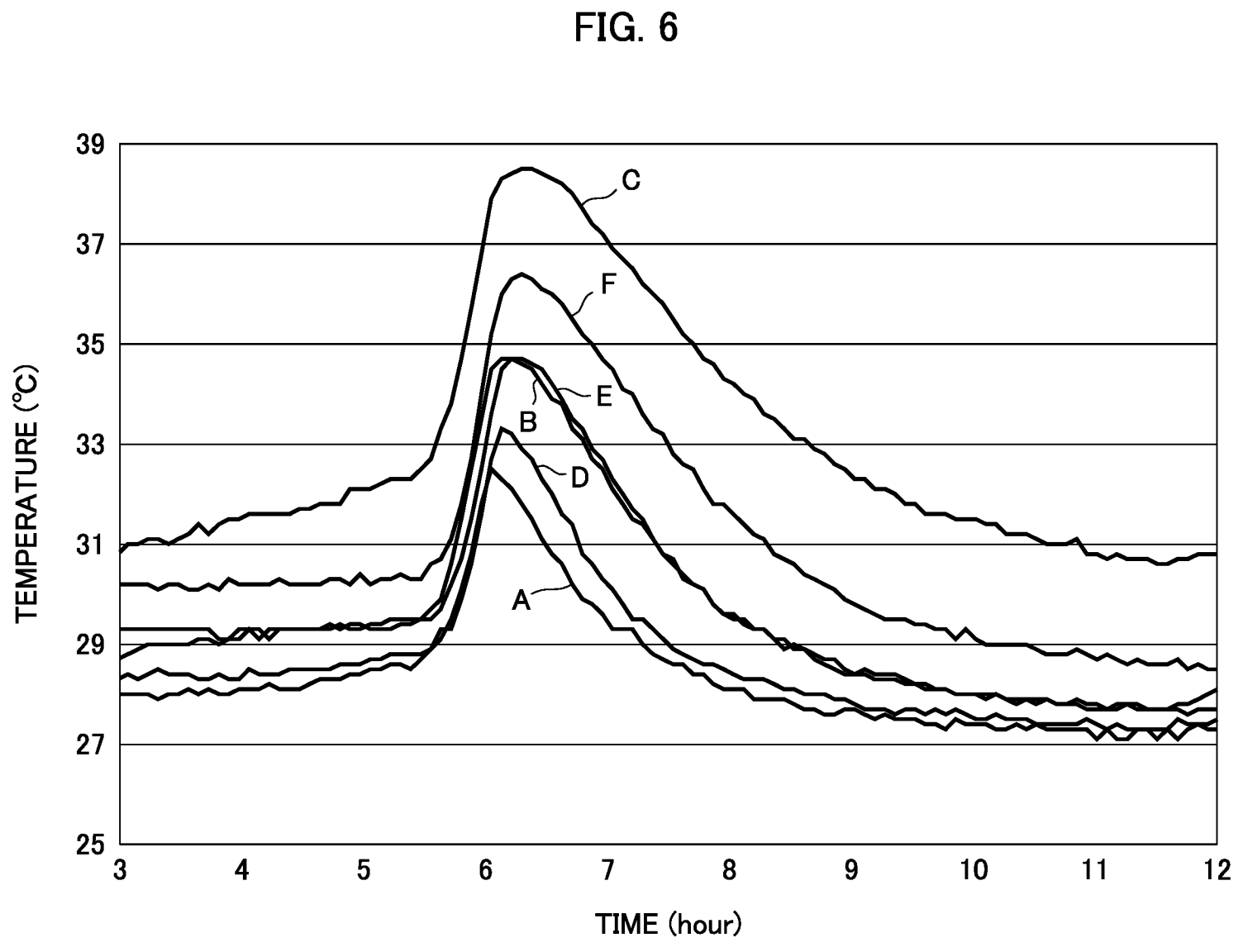

Next, an experiment example in a case in which the secondary batteries A to F are supplementarily charged will be described. FIG. 6 is a waveform representing changes in temperatures in a case in which the secondary batteries A to F are charged at the same time. More specifically, FIG. 6 represents a change in temperature of each of the secondary batteries A to F in a case in which the horizontal axis represents a time that has elapsed after simultaneous charging is started and the vertical axis represents a battery temperature. In the present embodiment, the secondary batteries A to F are fully charged in about 6.2 hours after the simultaneous charging is started, the supplementary charging is thus ended, and from the peak temperatures at this time, the temperatures decrease toward the ordinary temperature.

It is possible to observe that the peak temperatures in the present embodiment are relatively low in the secondary batteries A and D that are located on the windward side in the air flow direction and are relatively high in the secondary batteries C and F that are located on the downwind side in the air flow direction, and it is possible to ascertain how much a temperature difference is caused, from the results of FIG. 6.

Figure 7:
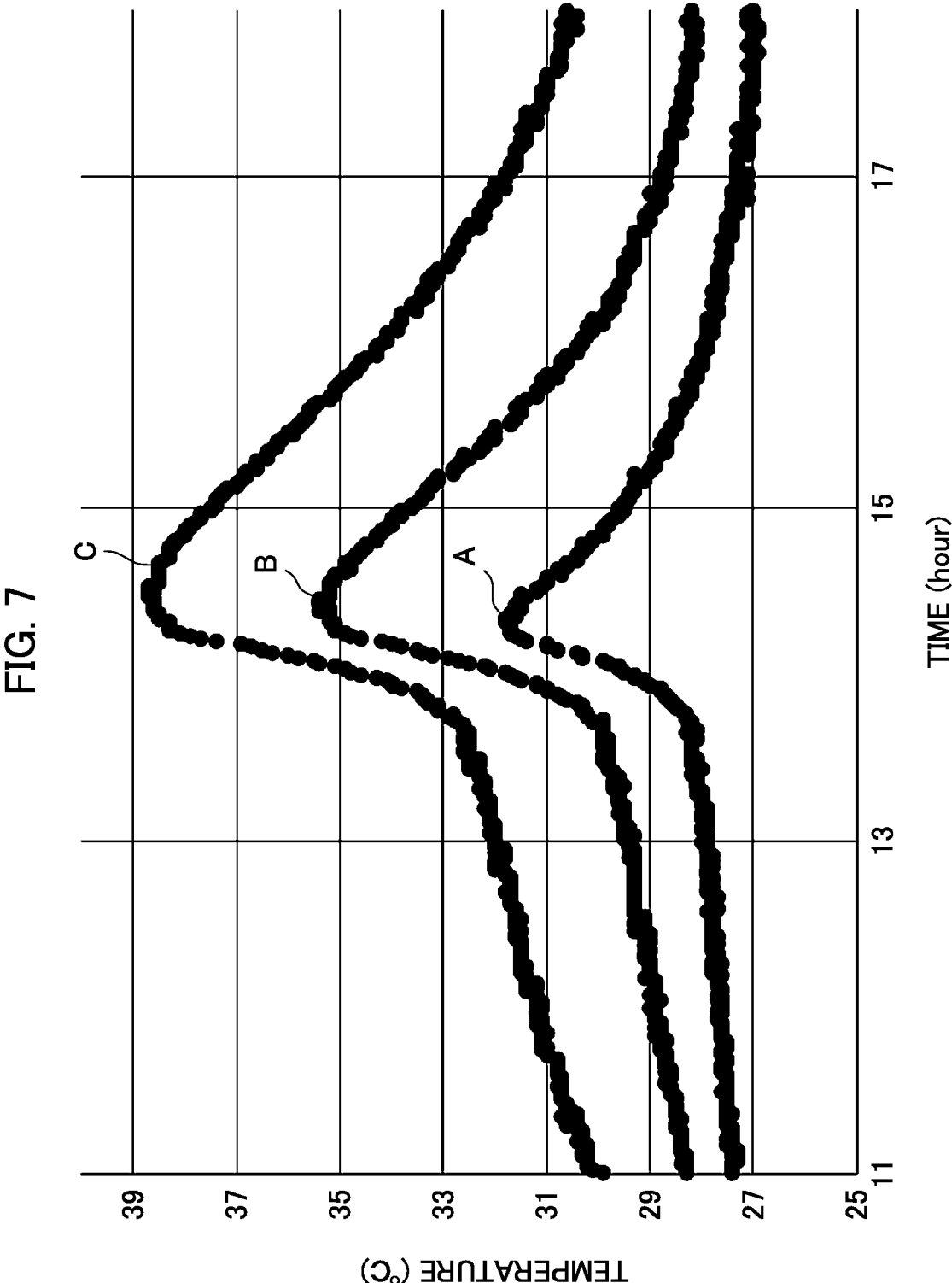
FIG. 7 is waveforms representing changes in temperatures at the time of split charging in a case in which a predicted peak temperature difference is not minimum.

Next, a difference in effects depending on selection of a combination pattern will be described. FIG. 7 is waveforms representing changes in temperatures at the time of split charging in a case in which the predicted peak temperature difference is not minimum. Here, changes in temperatures of the secondary batteries A to C in a case in which split charging is performed by employing grouping <D, E, F: A, B, C> that does not minimize the peak temperature difference from among the combination patterns listed in the listing step are illustrated.

More specifically, a temperature change of each of the secondary batteries A to C in a case in which the charging groups are set with the secondary batteries D to F included in the first group and with the secondary batteries A to C included in the second group and the second group is fully charged after the first group is fully charged is illustrated. Note that the horizontal axis in FIG. 7 represents a time that has elapsed after the split charging is started, that is, a total elapse time of each group on the assumption that the charging start time of the first group is 0. Also, since each of the secondary batteries A to C and each of the secondary batteries D to F have mutually corresponding arrangement in the casing and mutually corresponding air flow directions, and the changes in temperature exhibit mutually similar trends, illustration of the changes in temperatures of the secondary batteries D to F is omitted here.

According to the result of FIG. 7, the peak temperature difference between the secondary battery A (≈secondary battery D) with the minimum peak temperature and the secondary battery C (≈secondary battery F) with the maximum peak temperature shows a variation that is as relatively large as about 7°.

Figure 8:
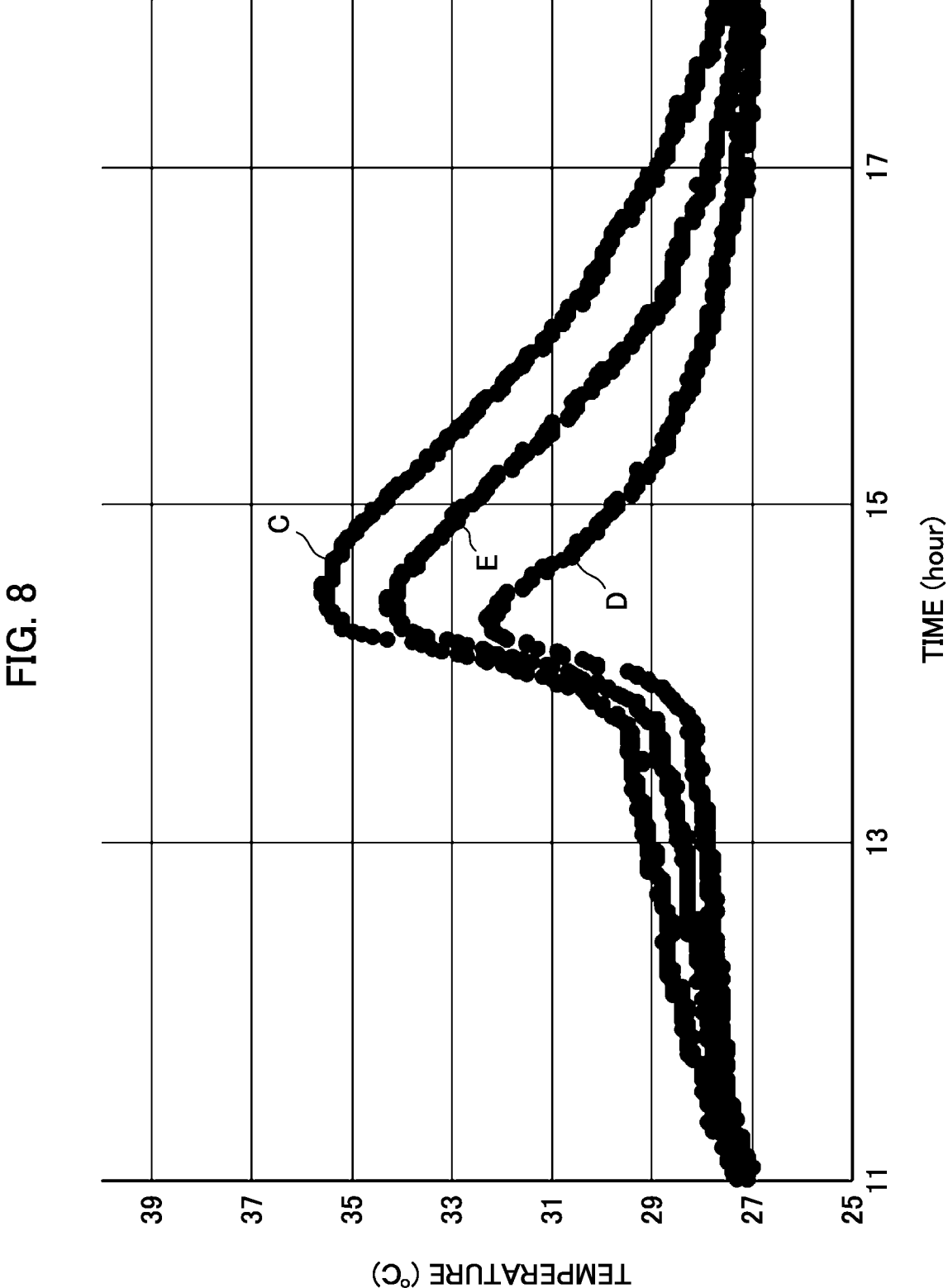
FIG. 8 is waveforms representing changes in temperatures at the time of split charging in a case in which a predicted peak temperature difference is minimum.

FIG. 8 is waveforms representing changes in temperatures at the time of split charging in a case in which the predicted peak temperature difference is minimum. Here, changes in temperatures of the secondary batteries D, E, and C in a case in which split charging is performed by employing grouping <A, B, F: D, E, C> that minimizes the peak temperature difference from among the combination patterns listed in the listing step are illustrated.

More specifically, a change in temperature of each of the secondary batteries D, E, and C in a case in which the charging groups are set with the secondary batteries A, B, and F included in the first group and with the secondary batteries D, E, and C included in the second group and the second group is fully charged after the first group is fully charged is illustrated. Note that the horizontal axis in FIG. 8 represents a time that has elapsed after the split charging is started, that is, a total elapse time of each group on the assumption that the charging start time of the first group is 0. Also, since each of the secondary batteries D, E, and C and each of the secondary batteries A, B, and F have mutually corresponding arrangement in the casing and mutually corresponding air flow directions, and the changes in temperatures exhibit mutually similar trends, illustration of changes in temperatures of the secondary batteries A, B, and F is omitted here.

According to the result of FIG. 8, the peak temperature difference between the secondary battery D (≈secondary battery A) with the minimum peak temperature and the secondary battery C (≈secondary battery F) with the maximum peak temperature exhibits a variation that is as relatively small as about 3.5°.

Therefore, it is possible to minimize the peak temperature difference of the secondary batteries A to F and to curb the concern that degradation advances only in some specific secondary batteries by applying the aforementioned charging method to the supplementary charging of the backup power supply device 1.

As described above, according to the backup power supply device 1 in the present embodiment, a temperature rise trend is ascertained by charging the secondary batteries A to F accommodated in the casing 11 at the same time in the initial supplementary charging and acquiring the peak temperature of each of the secondary batteries A to F. Also, the backup power supply device 1 optimizes the combination pattern of the split charging in the next supplementary charging on the basis of the measured peak temperatures. In this manner, the backup power supply device 1 can perform split charging as the next supplementary charging in the combination pattern that minimizes the peak temperature difference of the secondary batteries A to F by the aforementioned charging method, degradation is not localized only at some specific batteries, and it is thus possible to curb shortening of a dischargeable time due to the variation in temperature of the secondary batteries A to F at the time of the charging.

Although the description of the present embodiment will end hitherto, the present disclosure is not limited to the above embodiment. For example, although the above embodiment has been described as an example in which the casing 11 of the backup power supply device 1 has the configuration illustrated in FIG. 4, the casing 11 may have a configuration in which the cooling fan 14 is not provided, and further, the casing 11 may be tightly closed with no intake port 12 and the exhaust port 13.

In such cases, the backup power supply device 1 does not forcibly cool the inside of the casing 11 with air, or air does not pass between the inside and the outside of the casing at all. Therefore, if the secondary batteries A to D are charged at the same time in the initial supplementary charging, the peak temperatures of the secondary batteries B and E are likely to be relatively raised due to adjacency.

Thus, the control device 10 selects, for example, a combination pattern <B, E: A, C, D, F> through the split pattern determination processing P. In this manner, the secondary batteries B and E that are not adjacent to each other are charged as a first group, and the secondary batteries A, C, D, and F are then charged as a second group. Therefore, the secondary batteries B and E with relatively high peak temperatures do not receive radiant heat and easily dissipate heat since the temperature in the surroundings is not high at the time of charging, and it is thus possible to curb a peak temperature rise. On the other hand, the secondary batteries A, C, D, and F with relatively low peak temperatures are charged in a state in which they are adjacent to the secondary battery B or E in a high-temperature state immediately after full charging, and it is thus possible to slightly raise the peak temperatures as compared with a state in which there is no heat exchange. As a result, the backup power supply device 1 can curb a variation in peak temperatures of the secondary batteries A to F and to exhibit similar effects and advantages to those of the aforementioned embodiment.

<Implementation Modes of Present Disclosure>

A first implementation mode of the present disclosure is a charging method for supplementarily charging a plurality of secondary batteries accommodated in a casing on a regular basis, the method including the steps of: charging the plurality of secondary batteries at the same time at the time of initial supplementary charging; acquiring each of peak temperatures during charging of the plurality of secondary batteries; listing combination patterns when the plurality of secondary batteries are split into a plurality of charging groups; predicting, for each of the combination patterns, each of the peak temperatures in a case in which charging is performed for each of the charging groups, on the basis of the peak temperatures at the time of the initial supplementary charging; and split-charging the plurality of secondary batteries in the combination pattern that minimizes a variation in the predicted peak temperatures.

In the charging method according to the first implementation mode, a temperature rise trend is recognized by charging the plurality of secondary batteries in the casing at the same time in the initial supplementary charging and acquiring the peak temperature of each secondary battery. Also, a combination pattern of split charging in the next supplementary charging is optimized on the basis of the measured peak temperature in the charging method. Thus, according to the charging method in the first implementation mode, it is possible to perform split charging as the next supplementary charging in the combination pattern that minimizes a peak temperature difference among the secondary batteries, degradation is not localized only at some specific secondary batteries, and it is thus possible to curb shortening of a dischargeable time due to a variation in temperatures of the secondary batteries at the time of the charging.

In the charging method according to a second implementation mode of the present disclosure, in the predicting of each of the peak temperatures, predicted values of the peak temperatures are corrected on the basis of arrangement of the plurality of secondary batteries in the casing, which is stored in advance, in the first implementation mode.

According to the charging method in the second implementation mode, the predicted values are adjusted on the basis of the layout, such as adjacency, of the plurality of secondary batteries in the prediction of the combination pattern that minimizes the variation in peak temperatures, and it is thus possible to perform more accurate prediction in consideration of an influence of radiant heat.

In the charging method according to a third implementation mode of the present disclosure, in the predicting of each of the peak temperatures, predicted values of the peak temperatures are corrected on the basis of an air flow direction inside the casing, which is stored in advance, in the first or second implementation mode described above.

According to the charging method in the third implementation mode, the predicted values are adjusted on the basis of the air flow direction inside the casing in the prediction of the combination pattern that minimizes the variation in peak temperatures, and it is thus possible to perform more accurate prediction in consideration of cooling efficiency of each of the plurality of secondary batteries.

In the charging method according to a fourth implementation mode of the present disclosure, in a case in which the variation in peak temperatures in the split-charging of the plurality of secondary batteries is greater than a predetermined temperature threshold value, the combination pattern that minimizes the variation in the peak temperatures is updated with next supplementary charging regarded as the initial supplementary charging, in any of the first to third implementation modes described above.

According to the charging method in the fourth implementation mode, an increase in variation in peak temperatures in the case of split charging is detected, the combination pattern is then updated, and it is thus possible to optimize the combination pattern even in a case in which a situation such as a change in surrounding environment occurs during regular repetition of supplementary charging in a long-term operation.

In the charging method according to a fifth implementation mode of the present disclosure, in a case in which the split charging reaches a predetermined number of times, the combination pattern that minimizes the variation in the peak temperatures is updated with next supplementary charging regarded as the initial supplementary charging, in any of the first to third implementation modes described above.

According to the charging method in the fifth implementation mode, the combination pattern is updated on a regular basis by performing charging at the same time as supplementary charging every predetermined number of times in a long-term operation, and it is thus possible to optimize the combination pattern even in a case in which a situation such as a change in surrounding environment occurs.

A backup power supply device according to a sixth implementation mode of the present disclosure includes: a plurality of secondary batteries that are accommodated in a casing; a charging switch that individually connects and disconnects charging power of the plurality of secondary batteries; a temperature sensor that individually measures temperatures of the plurality of secondary batteries; and a control device that supplementarily charges the plurality of secondary batteries via the charging switch on a regular basis, the control device charging the plurality of secondary batteries at the same time at the time of initial supplementary charging and acquiring each of peak temperatures, listing combination patterns when the plurality of secondary batteries are split into a plurality of charging groups, predicting, for each of the combination patterns, each of the peak temperatures in a case in which charging is performed for each of the charging groups, on the basis of the peak temperatures at the time of the initial supplementary charging, and split-charging the plurality of secondary batteries in the combination pattern that minimizes a variation in the predicted peak temperatures.

According to the backup power supply device in the sixth implementation mode, a temperature rise trend is recognized by the control device charging the plurality of secondary batteries in the casing at the same time at the time of the initial supplementary charging and acquiring the peak temperature of each secondary battery. Also, the control device optimizes the combination pattern of the split charging in the next supplementary charging on the basis of the measured peak temperatures. Thus, according to the backup power supply device in the sixth implementation mode, it is possible to perform split charging as the next supplementary charging in the combination pattern that minimizes the peak temperature difference of the secondary batteries, degradation is not localized only at some specific secondary batteries, and it is thus possible to curb shortening of a dischargeable time due to a variation in temperatures of the secondary batteries at the time of the charging.

In the backup power supply device according to a seventh implementation mode of the present disclosure, the control device corrects predicted values of the peak temperatures on the basis of arrangement of the plurality of secondary batteries in the casing, which is stored in advance, in the sixth implementation mode described above.

According to the backup power supply device in the seventh implementation mode, the predicted values are adjusted on the basis of the layout, such as adjacency, of the plurality of secondary batteries in the prediction of the combination pattern that minimizes the variation in peak temperatures, and it is thus possible to perform more accurate prediction in consideration of an influence of radiant heat.

In the backup power supply device according to an eighth implementation mode of the present disclosure, the control device corrects predicted values of the peak temperatures on the basis of an air flow direction inside the casing, which is stored in advance, in the sixth or seventh implementation mode described above.

According to the backup power supply device in the eighth implementation mode, the predicted values are adjusted on the basis of the air flow direction inside the casing in the prediction of the combination pattern that minimizes the variation in peak temperatures, and it is thus possible to perform more accurate prediction in consideration of cooling efficiency of each of the plurality of secondary batteries.

In the backup power supply device according to a ninth implementation mode of the present disclosure, in a case in which the variation in the peak temperatures in the split charging is greater than a predetermined temperature threshold value, the control device updates the combination pattern that minimizes the variation in the peak temperatures with next supplementary charging regarded as the initial supplementary charging, in any of the sixth to eighth implementation modes described above.

According to the backup power supply device in the ninth implementation mode, an increase in variation in peak temperatures in the case of split charging is detected, the combination pattern is then updated, and it is thus possible to optimize the combination pattern even in a case in which a situation such as a change in surrounding environment occurs in regular repetition of supplementary charging in a long-term operation.

In the backup power supply device according to a tenth implementation mode of the present disclosure, in a case in which the split charging reaches a predetermined number of times, the control device updates the combination pattern that minimizes the variation in the peak temperatures with next supplementary charging regarded as the initial supplementary charging, in any of the sixth to eighth implementation modes described above.

According to the backup power supply device in the tenth implementation mode, the combination pattern is updated on the regular basis by performing the charging at the same time as supplementary charging every predetermined number of times in a long-term operation, and it is thus possible to optimize the combination pattern even in a case in which a situation such as a change in surrounding environment occurs.

REFERENCE SIGNS LIST

1 Backup power supply device
2 External power supply
3 External load
4 System switching switch
5 Charger
6 Inverter
10 Control device
11 Casing
12 Intake port
13 Exhaust port
14 Air cooling fan
15 Circuit substrate
SWc Charging switch
SWd Discharging switch
Dc Charging diode
Dd Discharging diode

What is claimed is:

1. A charging method for supplementarily charging, on a regular basis, a plurality of secondary batteries accommodated in a casing, the method comprising the steps of:
   charging the plurality of secondary batteries at the same time at a time of initial supplementary charging;
   acquiring each of peak temperatures during charging of the plurality of secondary batteries at the time of initial supplementary charging;
   listing combination patterns when the plurality of secondary batteries are split into a plurality of charging groups;
   predicting, for each of the combination patterns, each of the peak temperatures in a case in which charging is performed for each of the charging groups, on the basis of the peak temperatures at the time of the initial supplementary charging; and
   split-charging the plurality of secondary batteries in the combination pattern that minimizes a variation in the predicted peak temperatures.

2. The charging method according to claim 1, wherein in the predicting of each of the peak temperatures, predicted values of the peak temperatures are corrected on the basis of arrangement of the plurality of secondary batteries in the casing, which is stored in advance.

3. The charging method according to claim 1, wherein in the predicting of each of the peak temperatures, predicted values of the peak temperatures are corrected on the basis of an air flow direction inside the casing, which is stored in advance.

4. The charging method according to claim 1, wherein in response to the variation in peak temperatures in the split-charging of the plurality of secondary batteries being greater than a predetermined temperature threshold value, the combination pattern that minimizes the variation in the peak temperatures is updated with next supplementary charging regarded as the initial supplementary charging.

5. The charging method according to claim 1, wherein in response to the split charging reaching a predetermined number of times, the combination pattern that minimizes the variation in the peak temperatures is updated with next supplementary charging regarded as the initial supplementary charging.

6. A backup power supply device comprising:

a plurality of secondary batteries that are accommodated in a casing;

a charging switch that individually connects and disconnects charging power of the plurality of secondary batteries;

a temperature sensor that individually measures temperatures of the plurality of secondary batteries; and a control device that supplementarily charges the plurality of secondary batteries via the charging switch on a regular basis, wherein the control device:

charges the plurality of secondary batteries at the same time at a time of initial supplementary charging and acquires each of peak temperatures, lists combination patterns when the plurality of secondary batteries are split into a plurality of charging groups, predicts, for each of the combination patterns, each of the peak temperatures in a case in which charging is performed for each of the charging groups, on the basis of the peak temperatures at the time of the initial supplementary charging, and split-charges the plurality of secondary batteries in the combination pattern that minimizes a variation in the predicted peak temperatures.

7. The backup power supply device according to claim 6, wherein the control device corrects predicted values of the peak temperatures on the basis of arrangement of the plurality of secondary batteries in the casing, which is stored in advance.

8. The backup power supply device according to claim 6, wherein the control device corrects predicted values of the peak temperatures on the basis of an air flow direction inside the casing, which is stored in advance.

9. The backup power supply device according to claim 6, wherein in in response to the variation in the peak temperatures in the split charging being greater than a predetermined temperature threshold value, the control device updates the combination pattern that minimizes the variation in the peak temperatures with next supplementary charging regarded as the initial supplementary charging.

10. The backup power supply device according to claim 6, wherein in response to the split charging reaching a predetermined number of times, the control device updates the combination pattern that minimizes the variation in the peak temperatures with next supplementary charging regarded as the initial supplementary charging.

* * * * *